United States Patent
Seo (10) Patent No.: US 12,477,824 B2
(45) Date of Patent: Nov. 18, 2025

(54) THIN FILM TRANSISTOR SUBSTRATE AND DISPLAY APPARATUS COMPRISING THE SAME

(71) Applicant: LG DISPLAY CO., LTD., Seoul (KR)

(72) Inventor: SeongMoh Seo, Seoul (KR)

(73) Assignee: LG Display Co., Ltd (KR)

( * ) Notice: Subject to any disclaimer, the term of this patent is extended or adjusted under 35 U.S.C. 154(b) by 459 days.

(21) Appl. No.: 17/555,802

(22) Filed: Dec. 20, 2021

(65) Prior Publication Data

US 2022/0208798 A1 Jun. 30, 2022

(30) Foreign Application Priority Data

Dec. 31, 2020 (KR) .......................... 10-2020-0188805

(51) Int. Cl.
*H10D 86/60* (2025.01)
*H10D 86/01* (2025.01)
*H10D 86/40* (2025.01)

(52) U.S. Cl.
CPC ........... *H10D 86/60* (2025.01); *H10D 86/021* (2025.01); *H10D 86/431* (2025.01)

(58) Field of Classification Search
CPC .................... H01L 27/1248; H10D 30/6755
See application file for complete search history.

(56) References Cited

U.S. PATENT DOCUMENTS

| | | | |
|---|---|---|---|
| 2015/0001487 A1* | 1/2015 | Kwon | H01L 27/1259 438/23 |
| 2017/0294456 A1* | 10/2017 | Lee | H01L 27/1225 |
| 2018/0061868 A1* | 3/2018 | Na | H10D 86/423 |
| 2019/0165184 A1* | 5/2019 | Ji | G09G 3/3648 |
| 2019/0189805 A1* | 6/2019 | Jang | H01L 29/7869 |
| 2020/0212221 A1* | 7/2020 | Baeck | H01L 29/78627 |

FOREIGN PATENT DOCUMENTS

| | | |
|---|---|---|
| KR | 20140125186 A | 10/2014 |
| KR | 20150003581 A | 1/2015 |
| KR | 20190062695 A | 6/2019 |
| KR | 20190072164 A | 6/2019 |

OTHER PUBLICATIONS

Office Action in Korean Appln. No. 10-2020-0188805, mailed on Feb. 20, 2025, 16 pages (with English translation).

* cited by examiner

*Primary Examiner* — Evren Seven
(74) *Attorney, Agent, or Firm* — Fish & Richardson P.C.

(57) ABSTRACT

A thin film transistor includes an oxide semiconductor layer on a substrate, a gate insulating layer on the oxide semiconductor layer, a gate electrode on the gate insulating layer, which at least partially overlaps the oxide semiconductor layer, a interlayer insulating layer on the gate electrode, and a source electrode and a drain electrode on the interlayer insulating layer, the oxide semiconductor layer includes a channel portion which overlaps with the gate electrode and a connection portion which at least partially does not overlap the gate electrode, the source electrode and the drain electrode are in contact with the connection portion of the oxide semiconductor layer, the interlayer insulating layer is in contact with the connection portion of the oxide semiconductor layer, a hydrogen concentration of the connection portion is higher than a hydrogen concentration of the channel portion, and the interlayer insulating layer, the source electrode, and the drain electrode are in contact with the connection portion.

9 Claims, 5 Drawing Sheets

THIN FILM TRANSISTOR SUBSTRATE AND DISPLAY APPARATUS COMPRISING THE SAME

CROSS-REFERENCE TO RELATED APPLICATION

This application claims the priority of Korean Patent Application No. 10-2020-0188805 filed on Dec. 31, 2020, which is hereby incorporated by reference in its entirety.

BACKGROUND

Field of the Disclosure

The present disclosure relates to a thin film transistor substrate and a display apparatus including the same.

Description of the Background

A thin film transistor can be manufactured on a glass substrate or a plastic substrate so that it has been widely used as a switching element or a driving element of a display device such as a liquid crystal display device or an organic light emitting device.

The thin film transistor may be classified into an amorphous silicon thin film transistor, a polycrystalline silicon thin film transistor, and an oxide semiconductor thin film transistor, depending on a material which configures an active layer of the thin film transistor. The amorphous silicon thin film transistor uses amorphous silicon for an active layer, the polycrystalline silicon thin film transistor uses polycrystalline silicon for an active layer, and the oxide semiconductor thin film transistor uses oxide semiconductor for an active layer.

The amorphous silicon is deposited at a short period of time to form an active layer so that the amorphous silicon thin film transistor (a-Si TFT) has advantages of a relatively short manufacturing process time and a low production cost. In contrast, due to the low mobility, a current driving ability is not desirable and the threshold voltage varies so that the amorphous silicon thin film transistor may be restricted to be used for an active matrix organic light emitting diode (AMOLED).

The polycrystalline silicon thin film transistor (poly-Si TFT) is manufactured by crystallizing amorphous silicon after depositing the amorphous silicon. During the manufacturing process of the polycrystalline silicon thin film transistor, a process of crystallizing the amorphous silicon is necessary so that the number of processes is increased, which results in an increased manufacturing cost. Further, the crystallization process is performed at a high process temperature so that it is difficult to apply the polycrystalline silicon thin film transistor to a large size device. Further, due to the poly-crystallization characteristic, it is difficult to ensure uniformity of the polycrystalline silicon thin film transistor.

In the case of the oxide semiconductor thin film transistor (Oxide TFT), even though the oxide semiconductor layer is formed at a low temperature, a high mobility can be obtained. Further, change of the resistance is large in accordance with a content of oxygen, so that it is very easy to obtain a desired physical property. Accordingly, the oxide semiconductor thin film transistor has attracted great interest in the application as the thin film transistor. Specifically, an example of oxide semiconductor to be used for the active layer may include zinc oxide (ZnO), indium zinc oxide (InZnO), or indium gallium zinc oxide (InGaZnO4). A thin film transistor including an oxide semiconductor active layer may be formed with various structures, and among them, a coplanar or back-channel etch structure is widely used due to device characteristics.

However, an oxide semiconductor layer of the oxide semiconductor thin film transistor can be damaged during a patterning process including etching or annealing of the manufacturing process so that a driving stability and the reliability of the thin film transistor can be degraded.

SUMMARY

Accordingly, the present disclosure is directed to a thin film transistor substrate and a display apparatus including the same that substantially obviates one or more of problems due to limitations and disadvantages of the conventional thin film transistors.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

The present disclosure is to provide a thin film transistor including an oxide semiconductor layer having an insulating layer containing hydrogen as a connection portion.

More specifically, the present disclosure is also to provide a thin film transistor which includes a connection portion which is formed as a conductor by hydrogen diffusion from a connection portion of an insulating layer containing hydrogen is included and a manufacturing method thereof to improve an operation characteristic and suppress the degradation of the reliability.

Further, the present disclosure is to provide a thin film transistor which includes an insulating layer which covers an entire surface of the gate electrode and a manufacturing method thereof to suppress insulation failure between the gate electrode and the oxide semiconductor layer.

In order to achieve the above-described, according to an aspect of the present disclosure, a thin film transistor includes an oxide semiconductor layer on a substrate; a gate insulating layer on the oxide semiconductor layer; a gate electrode on the gate insulating layer, which at least partially overlaps the oxide semiconductor layer; a interlayer insulating layer on the gate electrode; and a source electrode and a drain electrode on the interlayer insulating layer, the oxide semiconductor layer includes a channel portion which overlaps the gate electrode and a connection portion which at least partially does not overlap the gate electrode, the source electrode and the drain electrode are in contact with the connection portion of the oxide semiconductor layer, the interlayer insulating layer is in contact with the connection portion of the oxide semiconductor layer, a hydrogen concentration of the connection portion is higher than a hydrogen concentration of the channel portion, and the interlayer insulating layer, the source electrode, and the drain electrode are in contact with the connection portion.

The gate insulating layer is disposed on an entire surface of the oxide semiconductor layer which is opposite to the substrate.

The interlayer insulating layer includes hydrogen more than the gate insulating layer.

The connection portion simultaneously includes a surface which is in contact with the interlayer insulating layer and a surface which is in contact with the source electrode and the drain electrode.

The interlayer insulating layer may be configured by a first interlayer insulating layer on the gate insulating layer and a second interlayer insulating layer on the first interlayer insulating layer.

The gate insulating layer and the interlayer insulating layer cover the entire surface of the gate electrode.

The second interlayer insulation layer includes hydrogen more than the first interlayer insulating layer.

The second interlayer insulating layer is composed of inorganic material including hydrogen and the second interlayer insulating layer is connected to the connection portion by means of at least two contact holes formed in the gate insulating layer and the first interlayer insulating layer.

According to another aspect of the present disclosure, a manufacturing method of a thin film transistor includes forming an oxide semiconductor layer on a substrate; forming a gate insulating layer on the oxide semiconductor layer; forming a gate electrode which at least partially overlaps the oxide semiconductor layer, on the gate insulating layer; forming a first interlayer insulating layer on the gate electrode; forming a second interlayer insulating layer on the first interlayer insulating layer to be connected to the oxide semiconductor layer; diffusing hydrogen (H) atoms of the second interlayer insulating layer into the oxide semiconductor layer; and forming a source electrode and a drain electrode on the second interlayer insulating layer to be connected to the oxide semiconductor layer.

The gate insulating layer is formed on the entire surface of the oxide semiconductor layer.

The forming of a second interlayer insulating layer includes: depositing the second interlayer insulating layer on an entire surface of the first interlayer insulating layer; annealing the second interlayer insulating layer; and forming a contact hole.

In the annealing of the second interlayer insulating layer, a connection portion of the oxide semiconductor layer is formed by diffusion of hydrogen (H) to the oxide semiconductor layer and the connection portion is doped to have a carrier density higher than that of an area excluding the connection portion.

The first interlayer insulating layer is formed so as to cover at least two surfaces of the gate electrode.

According to the present disclosure, an insulating layer containing hydrogen is configured on an oxide semiconductor layer as a connection portion and is formed as a conductor therefrom to improve the operation characteristic of the thin film transistor and suppress the degradation of the reliability.

In addition, according to the present disclosure, the insulating layer covers the entire surface of the gate electrode to suppress insulation failure between a gate electrode and an oxide semiconductor layer of the thin film transistor.

Further, according to the present disclosure, the thin film transistor as described above is included to provide a display device having excellent reliability and driving stability.

Other features and advantages of the present disclosure will be described below in addition to the above-mentioned effects. The description and explanation may help those skilled in the art to clearly understand the feature and the effect of the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Advantages and characteristics of the present disclosure and a method of achieving the advantages and characteristics will be clear by referring to exemplary aspects described below in detail together with the accompanying drawings. However, the present disclosure is not limited to the exemplary aspect disclosed herein but will be implemented in various forms. Exemplary aspects introduced herein are provided to make disclosed contents thorough and complete and sufficiently transfer the spirit of the present disclosure to those skilled in the art. The present disclosure is defined only by the scope of the claims.

The shapes, sizes, ratios, angles, numbers, and the like illustrated in the accompanying drawings for describing the exemplary aspects of the present disclosure are merely examples, and the present disclosure is not limited thereto. Throughout the specification, like reference numerals denote like components. Further, in the following description, a detailed explanation of known related technologies may be omitted to avoid unnecessarily obscuring the subject matter of the present disclosure.

The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

For example, when a position relationship of two parts is described by "on", "above", "below", or "at a side", if an expression such as "immediately" or "directly" is not used, one or more parts may be located between two parts.

Spatially relative terms such as "below, beneath", "lower", "above", or "upper" may be used to easily describe the correlation between one element or components and other element or components as illustrated in the drawings. The spatially relative terms should be understood to include different directions of the elements when the elements are used or operated in addition to the direction illustrated in the drawings. For example, when the element illustrated in the drawing is turned over, an element which is disposed "below" or "beneath" other element may be disposed "above" other element. Accordingly, the exemplarily term "below" or "beneath" may include both downward and upward directions. Similarly, an exemplary term "above" or "on" may include both upward and downward directions.

When the relation of a time sequential order is described using the terms such as "after", "continuously to", "next to", and "before", the order may not be continuous unless the terms are used with the term "immediately" or "directly".

Although the terms "first", "second", and the like are used for describing various components, these components are not confined by these terms. These terms are merely used for distinguishing one component from the other components.

Therefore, a first component to be mentioned below may be a second component in a technical concept of the present disclosure.

The term "at least one" is understood to include all combinations which can be proposed from one or more related items. For example, "at least one of a first item, a second item, and a third item" may mean not only each of the first item, the second item, and the third item, but also a combination of all items to be proposed from two or more of the first item, the second item, and the third item.

The features of various aspects of the present disclosure can be partially or entirely bonded to or combined with each other and can be interlocked and operated in technically various ways, and the aspects can be carried out independently of or in association with each other.

When reference numerals refer to components of each drawing, although the same components are illustrated in different drawings, the same components are referred to by the same reference numerals as possible.

In the exemplary aspect of the present disclosure, a source electrode and a drain electrode are distinguished for the convenience of description so that the source electrode and the drain electrode may be exchangeably used. Therefore, the source electrode may be a drain electrode and the drain electrode may be a source electrode. Further, a source electrode in any one exemplary aspect may be a drain electrode in the other exemplary aspect and a drain electrode in any one exemplary aspect may be a source electrode in the other exemplary aspect.

In some exemplary aspects of the present disclosure, for the convenience of description, the source region and the source electrode are distinguished and the drain region and the drain electrode are distinguished, but the exemplary aspect of the present disclosure is not limited thereto. Therefore, the source region may be a source electrode and the drain region may be a drain electrode. Further, the source region may be a drain electrode and the drain region may be a source electrode.

Figure 1:
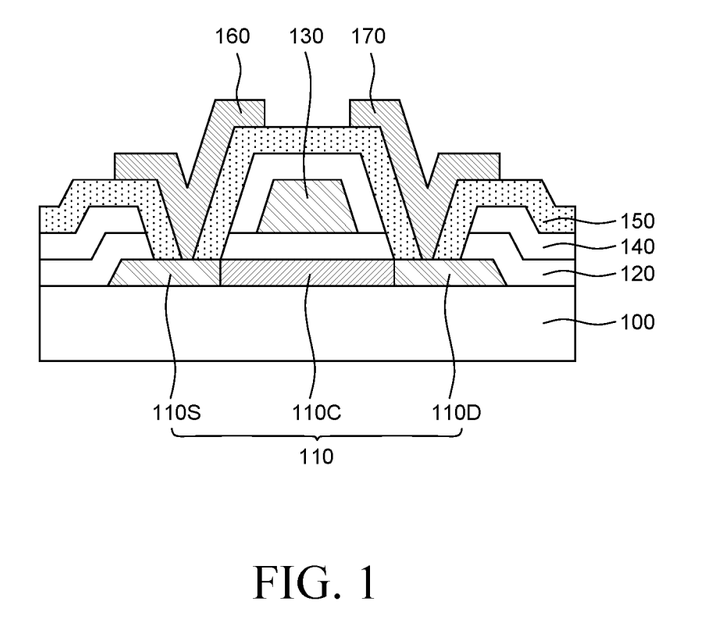
FIG. 1 is a cross-sectional view illustrating a thin film transistor according to an aspect of the present disclosure.

FIG. 1 is a cross-sectional view illustrating a thin film transistor according to an aspect of the present disclosure.

A thin film transistor illustrated in FIG. 1 includes a substrate 100, an active layer 110, a gate insulating layer 120, a gate electrode 130, a first interlayer insulating layer 140, a second interlayer insulating layer 150, a source electrode 160, and a drain electrode 170.

The substrate 100 may include at least one of glass and polymer resin. For example, a glass substrate or a polymer resin substrate may be used for the substrate 100. The polymer resin substrate may include a plastic substrate. The plastic substrate may include at least one of polyimide (PI), polycarbonate (PC), polyethylene (PE), polyester, polyethyleneterephthalate (PET), and polystyrene (PS) which are transparent polymer resins having flexibility.

The active layer 110 is disposed on the substrate 100 and includes an oxide semiconductor material. According to the exemplary aspect of the present disclosure, the active layer 110, for example, may be an oxide semiconductor layer formed of an oxide semiconductor material.

The active layer 110 may include one of ZO (ZnO) based, IZO (InZnO) based, IGZO (InGaZnO) based, TO (SnO) based, IGO (InGaO) based, ITO (InSnO) based, IGZTO (InGaZnSnO) based, GZTO (GaZnSnO) based, GZO (GaZnO) based, GO (GaO) based, IO (InO) based, and ITZO (InSnZnO) based oxide semiconductor materials. To be more specific, the active layer 110 may include one of ZO (ZnO) based, IZO (InZnO) based, IGZO (InGaZnO) based, and TO (SnO) based oxide semiconductor materials.

The active layer 110 includes a channel portion 110C, a first connection portion 110S, and a second connection portion 110D. The first connection portion 110S and the second connection portion 110D may be formed by selectively forming the active layer 110 as a conductor. The first connection portion 110S and the second connection portion 110D are disposed on both sides of the channel portion 110C.

The gate insulating layer 120 is disposed on the active layer 121. The gate insulating layer 120 may include one of silicon oxide and silicon nitride. The gate insulating layer 120 may have a single film structure or a multi-layered film structure.

The gate insulating layer 120 includes an insulating material, and for example, may include one of silicon oxide (SiOx), silicon nitride (SiNx), hafnium oxide (HfOx), aluminum oxide (AlOx), zirconium oxide (ZrOx), hafnium silicate (Hf—SiOx), and zirconium silicate (Zr—SiOx).

The gate electrode 130 is disposed on the gate insulating layer 120. The gate electrode 130 is spaced apart from the active layer 110 and overlaps with the active layer 110. The gate electrode 130 overlaps with the channel portion 110C of the active layer 110.

The gate electrode 130 may include one of aluminum based metal such as aluminum (Al) or an aluminum alloy, silver based metal such as silver (Ag) or an silver alloy, copper based metal such as copper (Cu) or a copper alloy, molybdenum based metal such as molybdenum (Mo) or a molybdenum alloy, chrome (Cr), tantalum (Ta), neodymium (Nd), and titanium (Ti). The gate electrode 130 may have a multi-layered film structure including at least two conductive films having different physical properties.

The first interlayer insulating layer 140 is disposed on the gate electrode 130. The first interlayer insulating layer 140 is formed of an insulating material. Specifically, the first interlayer insulting layer 140 may be formed of an organic material or an inorganic material, or may also be formed with a laminated structure of an organic layer and an inorganic layer.

The second interlayer insulating layer 150 is disposed on the first interlayer insulating layer 140. The second interlayer insulating layer 150 is connected to the active layer 110 through contact holes formed in the first interlayer insulating layer 140 and the gate insulating layer 120.

The source electrode 160 and the drain electrode 170 are disposed on the second interlayer insulating layer 150. The source electrode 160 and the drain electrode 170 are spaced apart from each other to be connected to the active layer 110. The source electrode 160 and the drain electrode 170 are connected to the active layer 110 through contact holes formed in the second interlayer insulating layer 150.

The source electrode 160 and the drain electrode 170 may include one of molybdenum (Mo), aluminum (Al), chrome (Cr), gold (Au), titanium (Ti), nickel (Ni), neodymium (Nd), copper (Cu), and an alloy thereof. The source electrode 160 and the drain electrode 170 may be formed of a single layer of metal or a metal alloy or may be formed of two or more multi-layers.

Figure 2:
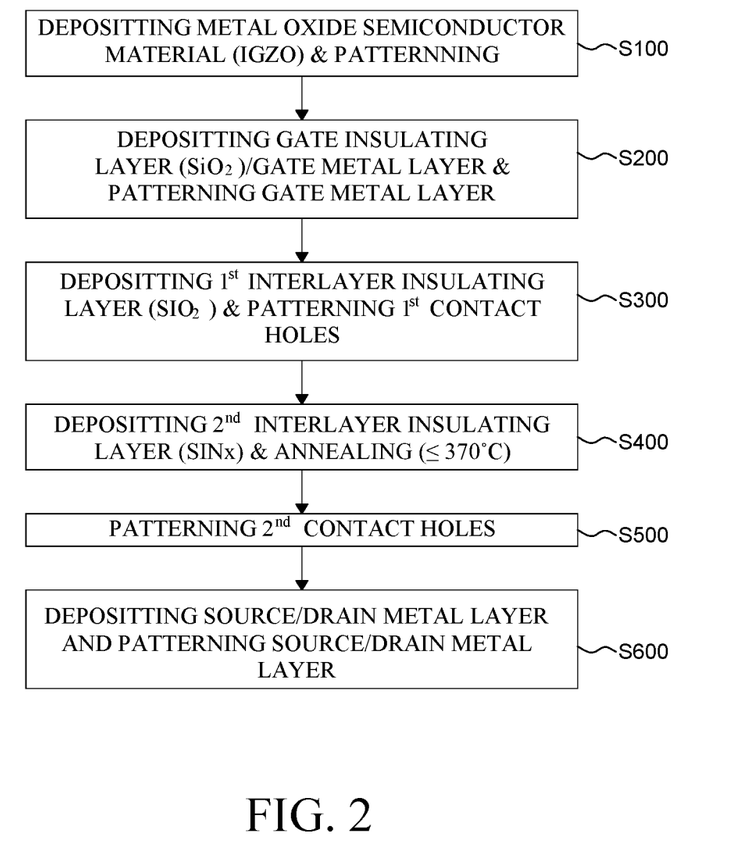
FIG. 2 is a flowchart for explaining a manufacturing method of a thin film transistor illustrated in FIG. 1.

FIG. 2 is a flowchart for explaining a manufacturing process of a thin film transistor according to an exemplary aspect of the present disclosure.

FIGS. 3A to 3F are cross-sectional views for explaining a manufacturing process of a thin film transistor according to an exemplary aspect of the present disclosure.

Figure 3A:
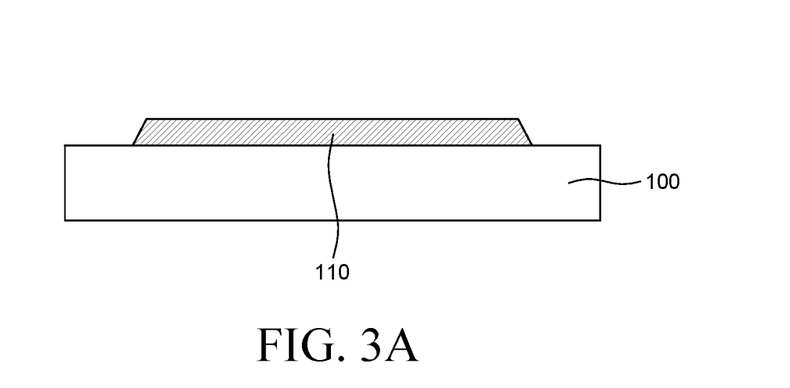
FIGS. 3A to 3F are cross-sectional views for explaining a manufacturing method of a thin film transistor illustrated in FIG. 1.

As illustrated in FIGS. 2 and 3A, the active layer 110 is formed on the substrate 100 (step S100).

Specifically, after depositing a metal oxide semiconductor material on the entire substrate 100 by a sputtering process or an organic metal chemical deposition process (MOCVD), the metal oxide semiconductor material is patterned by a photolithographic process and an etching process to form the active layer 110.

Figure 3B:
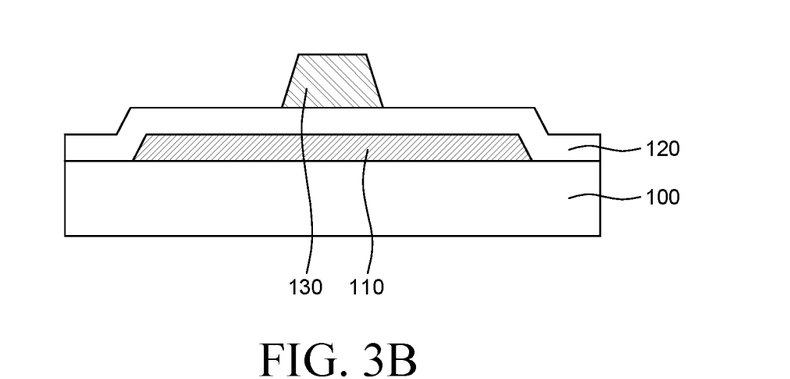

As illustrated in FIGS. 2 and 3B, the gate insulating layer 120 and the gate electrode 130 are formed on the substrate 100 on which the active layer 110 is formed (step S200).

Specifically, a gate insulating material is formed on the active layer 110 by the CVD deposition method and a gate metal layer is formed thereon by a deposition method such as a sputtering method. The gate insulating material may include an inorganic insulating material such as silicon oxide (SiOx) and silicon nitride (SiNx). The gate metal layer may include a single layer of a metal material such as molybdenum (Mo), titanium (Ti), copper (Cu), an aluminum and neodymium alloy (AlNd), aluminum (Al), chrome (Cr), and an alloy thereof or a multilayered structure using the metal material. Thereafter, the gate metal layer is patterned by the photolithographic process and the etching process to form the gate electrode 130.

Figure 3C:
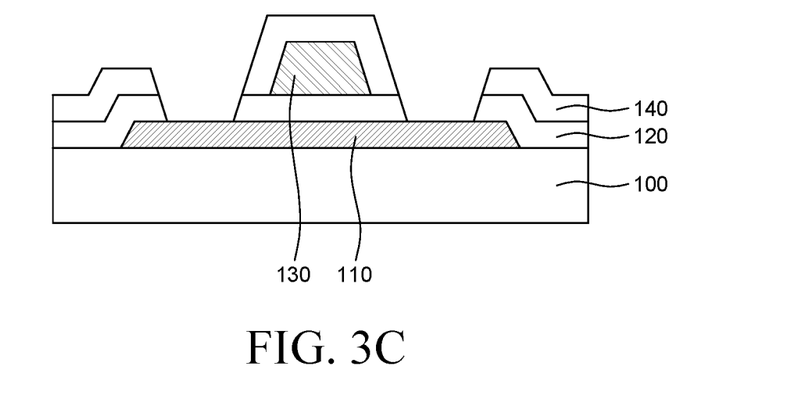

As illustrated in FIGS. 2 and 3C, the first interlayer insulating layer 140 having at least two contact holes is formed on the substrate 100 on which the gate electrode 130 is formed (step S300).

Specifically, the first interlayer insulating layer 140 is formed on the substrate 100 on which the gate electrode 130 is formed by a PECVD method, etc. As the first interlayer insulating material, an inorganic insulating material such as silicon oxide (SiOx) is used. Next, the gate insulating layer 120 and the first interlayer insulating layer 140 are patterned by the photolithographic process and the etching process to form a contact hole. Here, the contact hole passes through the gate insulating layer 120 and the interlayer insulating layer 140 to expose the active layer 110. Further, the entire surface of the gate electrode 130 may be covered by the gate insulating layer 120 and the first interlayer insulating layer 140. When the gate insulating layer 120 and the first interlayer insulating layer 140 completely cover the gate electrode 130, an insulation failure between the gate electrode 130 and the active layer 110 may be suppressed.

In the meantime, the gate insulating layer may also be patterned like the gate electrode. In this case, a leakage current may be caused between the gate electrode and the active layer or the gate electrode and the active layer may be shorted, due to residues of the gate electrode forming material or other impurities. As described above, when the leakage current or the short occur, the function of the thin film transistor is not properly performed.

In the exemplary aspect of the present disclosure, the gate insulating layer 120 and the first interlayer insulting layer 140 completely cover the gate electrode 130 so that the leakage current or the short between the gate electrode 130 and the active layer 110 is suppressed, to ensure the reliability of the thin film transistor. Specifically, even though the thickness of the gate insulating layer 120 is reduced, the leakage current or the short between the gate electrode 130 and the active layer 110 is not caused so that the thickness of the thin film transistor is reduced and a switching characteristic is improved.

Figure 3D:
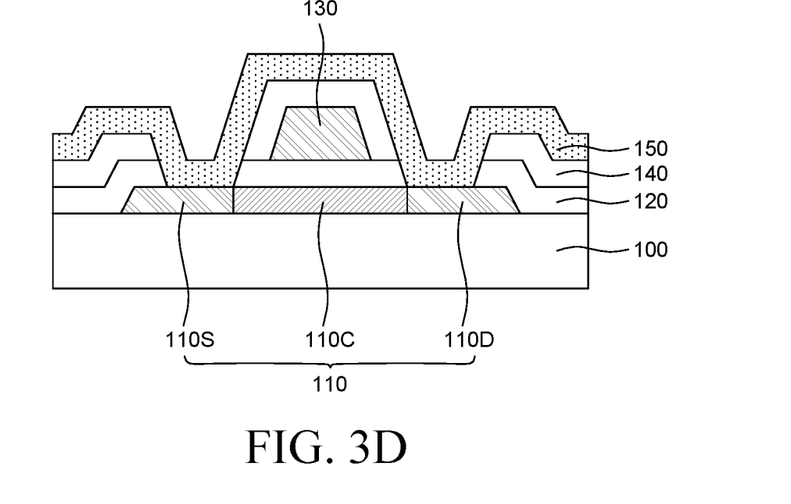

As illustrated in FIGS. 2 and 3D, the second interlayer insulating layer 150 is formed on the substrate 100 on which the first interlayer insulating layer 140 is formed and an annealing process is performed (step S400).

Specifically, the second interlayer insulating layer 150 is formed on the substrate 100 on which the first interlayer insulating layer 140 is formed, by the PECVD method, etc. As a second interlayer insulating material, an inorganic insulating material containing hydrogen such as silicon nitride (SiNx) is used. The second interlayer insulating layer 150 is connected to the active layer 110 by means of at least two contact holes formed in the gate insulating layer 120 and the first interlayer insulating layer 140.

Hereinafter, the active layer 110 of FIG. 3D will be described in detail.

The active layer 110 includes the channel portion 110C which overlaps with the gate electrode 130 and the first and second connection portions 110S and 110D which do not overlap with the gate electrode 130. Each portion of the first and second connection portions 110S is connected to the second interlayer insulating layer 150.

The channel portion 110C is a portion of the active layer 110 which overlaps with the gate electrode 130.

At least a part of the first and second connection portions 110S and 110D does not overlap the gate electrode 130. The entire first and second connection portions 110S and 110D do not overlap with the gate electrode 130 or a part of the first and second connection portions 110S and 110D may overlap with the gate electrode 130.

The first and second connection portions 110S and 110D may be formed by selectively forming the active layer 110 as a conductor. In order to form the active layer as a conductor, after forming the second interlayer insulating layer 150, the annealing process may be performed at a temperature of 370° C. or lower. Hydrogen atoms in the second interlayer insulating layer 150 are diffused into the first and second connection portions 110S and 110D of the active layer 110 by the annealing process. After the annealing process, the first and second connection portions 110S and 110D have excellent conductivity and high mobility. The active layer 110 may form an excellent electrical contact with the source electrode 160 and the drain electrode 170 through the first and second connection portions 110S and 110D. The first and second connection portions 110S and 110D are also called as "portions formed as conductors".

The first and second connection portions 110S and 110D include hydrogens (H). For example, the first and second connection portions 110S and 110D may be formed by doping a part of the active layer 110 with hydrogen (H). Here, the doping is performed by the diffusion of hydrogens (H) in the second interlayer insulating layer 150. Accordingly, a concentration of hydrogen (H) of the first and second connection portions 110S and 110D is higher than a concentration of hydrogen of the channel portion 110C.

When the active layer 110 is doped with hydrogen, hydrogen (H) atoms are coupled with oxygen (o) to form OH and generate free electrons so that a carrier density of the active layer 110 becomes higher to increase the conductivity. For example, referring to the following Chemical Formula, when a physical property of the active layer is IGZO (InGaZnO), in the ZnO bonding, the hydrogen (H) is coupled to oxygen (o) to form OH and generate free electrons. Further, also in the $In_2O_3$ bonding, the hydrogen (H) is coupled to oxygen (O) to form OH and generate free electrons. Accordingly, the first and second connection portions 110S and 110D doped with hydrogen may be formed as a conductor.

-continued

Generate electrons

Figure 3E:
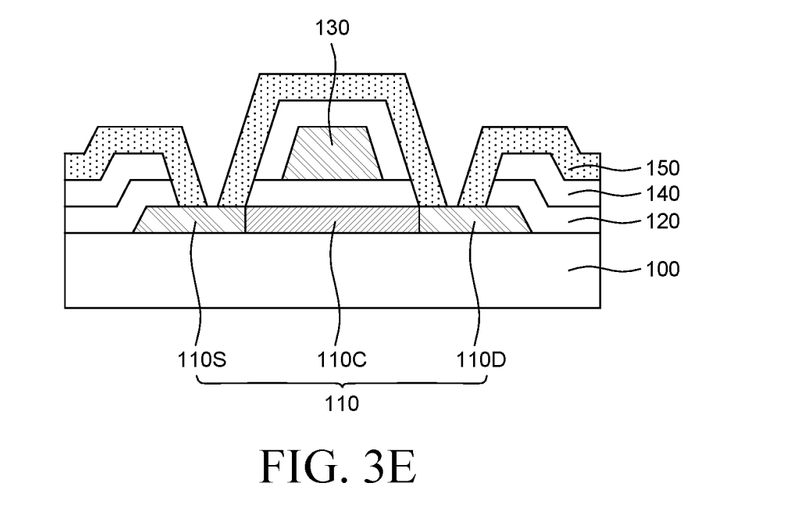

As illustrated in FIGS. 2 and 3E, contact holes are formed in the second interlayer insulating layer 150 (step S500).

Specifically, the second interlayer insulating layer 150 is patterned on the substrate on which the second interlayer insulating layer 150 is formed by the photolithographic process and the etching process to form a contact hole. Here, the contact hole passes through the second interlayer insulating layer 150 to expose the active layer 110.

Figure 3F:
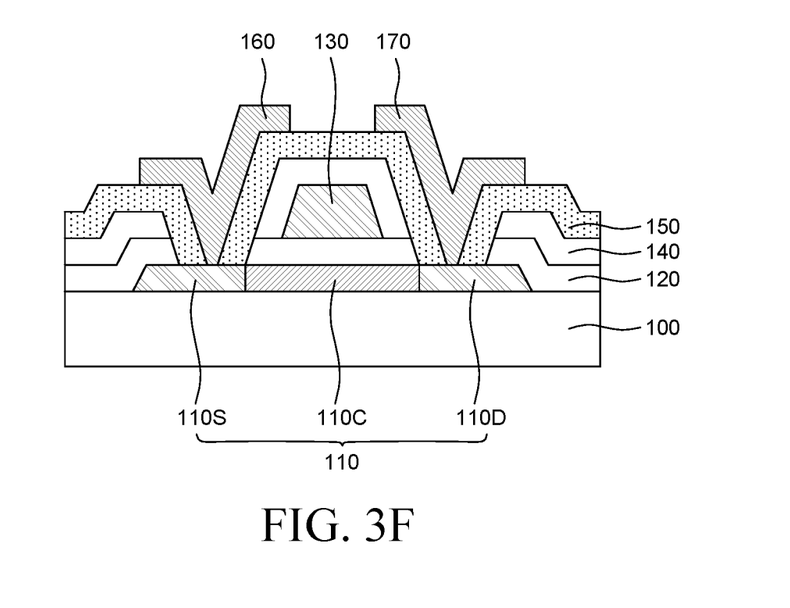

As illustrated in FIGS. 2 and 3F, the source electrode 160 and the drain electrode 170 are formed on the second interlayer insulating layer 150 (step S600).

Specifically, the source and drain metal layers are formed on the second interlayer insulating layer 150 having contact holes by a deposition method such as a sputtering method. Source and drain metal layers may include a single layer of a metal material such as molybdenum (Mo), titanium (Ti), copper (Cu), an aluminum and neodymium alloy (AlNd), aluminum (Al), chrome (Cr), and an alloy thereof or a multilayered structure of a metal material. Thereafter, the source and drain metal layers are patterned by the photolithographic process and the etching process to form the source electrode 160 and the drain electrode 170 on the second interlayer insulating layer 150.

The first and second connection portions 110S and 110D which are formed as conductors in the step S400 forms an excellent electrical contact with the source electrode 160 and the drain electrode 170 which are formed in the step S600. In contrast, the channel portion 110C is not hardly affected by the hydrogen doping (or diffusion) so that excellent semiconductor characteristic can be maintained.

As described above, according to the exemplary aspect of the present disclosure, the thin film transistor has an excellent reliability and a stable operation characteristic.

It will be appreciated that technical spirit of the present disclosure have been described herein for purposes of illustration by the above description and the accompanying drawings, and that combination, separation, substitution, and modifications of components may be made by those skilled in the art without departing from the scope and spirit of the present disclosure. Therefore, the exemplary aspects of the present disclosure are provided for illustrative purposes only but not intended to limit the technical concept of the present disclosure. The scope of the technical concept of the present disclosure is not limited thereto. The protective scope of the present disclosure should be construed based on the following claims, and all the technical concepts in the equivalent scope thereof should be construed as falling within the scope of the present disclosure.

What is claimed is:

1. A thin film transistor comprising:
an oxide semiconductor layer on a substrate;
a gate insulating layer on the oxide semiconductor layer;
a gate electrode on the gate insulating layer, which overlaps with the oxide semiconductor layer;
at least one interlayer insulating layer on the gate electrode; and
a source electrode and a drain electrode on the at least one interlayer insulating layer,
wherein the oxide semiconductor layer includes a channel portion which overlaps with the gate electrode and a connection portion which does not overlap with the gate electrode and in contact with the source electrode and the drain electrode, and
wherein the at least one interlayer insulating layer is in contact with the connection portion of the oxide semiconductor layer, a hydrogen concentration of the connection portion is higher than that of the channel portion, and the at least one interlayer insulating layer, the source electrode, and the drain electrode are in contact with the connection portion of the oxide semiconductor layer,
wherein the at least one interlayer insulating layer includes a first interlayer insulating layer on the gate insulating layer and a second interlayer insulating layer disposed on the first interlayer insulating layer,
wherein each of the gate insulating layer and the first interlayer insulating layer includes a first contact hole at a position overlapping the source electrode and the drain electrode, and the second interlayer insulating layer is disposed to cover each side of the gate insulating layer and side of the first interlayer insulating layer exposed by the first contact hole,
wherein the second interlayer insulating layer is connected to the connection portion through a second contact holes formed in the gate insulating layer and the first interlayer insulating layer,
the second interlayer insulation layer having hydrogen more than the first interlayer insulating layer is directly contact the oxide semiconductor layer, and
wherein the gate insulating layer and the first interlayer insulating layer include the same material, and the second interlayer insulating layer includes a different material from the gate insulating layer and the first interlayer insulating layer.

2. The thin film transistor according to claim 1, wherein the gate insulating layer is disposed on the oxide semiconductor layer.

3. The thin film transistor according to claim 1, wherein the at least one interlayer insulating layer includes hydrogen more than the gate insulating layer.

4. The thin film transistor according to claim 1, wherein a surface of the connection portion which is in contact with the at least one interlayer insulating layer is in contact with the source electrode and the drain electrode.

5. The thin film transistor according to claim 1, wherein the gate insulating layer and the at least one interlayer insulating layer cover an entire surface of the gate electrode.

6. The thin film transistor according to claim 1, wherein the second interlayer insulating layer includes an inorganic material having hydrogen.

7. A thin film transistor comprising:
an oxide semiconductor layer including a channel portion and first and second connection portions each adjacent to the channel portion;
a gate insulating layer disposed on the oxide semiconductor layer;
a gate electrode disposed on the gate insulating layer and overlapping with the active layer of the oxide semiconductor layer;
first and second interlayer insulating layers disposed on the gate electrode; and
source and drain electrodes disposed on the interlayer insulating layer and respectively contacting first and second connection portions, wherein the first and second connection portions have a higher hydrogen concentration than the channel portion, wherein the second interlayer insulating layer, the source electrode and the drain electrode are in contact with the first and second connection portions of the oxide semiconductor layer, and wherein the first and second interlayer insulating layers include a higher hydrogen concentration than the gate insulating layer, wherein each of the gate insulating layer and the first interlayer insulating layer includes a first contact hole at a position overlapping the source electrode and the drain electrode, and the second interlayer insulating layer is disposed to cover each side of the gate insulating layer and side of the first interlayer insulating layer exposed by the first contact hole, and wherein the second interlayer insulating layer is connected to the first and second connection portions through a second contact holes formed in the gate insulating layer and the first interlayer insulating layer, the second interlayer insulation layer having hydrogen more than the first interlayer insulating layer is directly contact the oxide semiconductor layer, and wherein the gate insulating layer and the first interlayer insulating layer include the same material, and the second interlayer insulating layer includes a different material from the gate insulating layer and the first interlayer insulating layer.

8. The thin film transistor according to claim 7, wherein the gate insulating layer and the at least one interlayer insulating layer cover an entire surface of the gate electrode.

9. The thin film transistor according to claim 7, wherein the second interlayer insulating layer includes an inorganic material having hydrogen.

* * * * *